United States Patent
Kim

(10) Patent No.: US 9,269,657 B2
(45) Date of Patent: Feb. 23, 2016

(54) FLEXIBLE STACK PACKAGES, ELECTRONIC SYSTEMS INCLUDING THE SAME, AND MEMORY CARDS INCLUDING THE SAME

(71) Applicant: SK hynix Inc., Icheon-si Gyeonggi-do (KR)

(72) Inventor: Jong Hoon Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 152 days.

(21) Appl. No.: 14/081,020

(22) Filed: Nov. 15, 2013

(65) Prior Publication Data

US 2014/0361427 A1    Dec. 11, 2014

(30) Foreign Application Priority Data

Jun. 5, 2013 (KR) .................. 10-2013-0065006

(51) Int. Cl.
| | |
|---|---|
| *H01L 23/498* | (2006.01) |
| *H01L 23/31* | (2006.01) |
| *H01L 23/00* | (2006.01) |
| *H01L 25/10* | (2006.01) |

(52) U.S. Cl.
CPC ...... *H01L 23/49811* (2013.01); *H01L 23/3107* (2013.01); *H01L 23/49816* (2013.01); *H01L 23/562* (2013.01); *H01L 25/105* (2013.01); *H01L 24/13* (2013.01); *H01L 24/16* (2013.01); *H01L 24/29* (2013.01); *H01L 24/32* (2013.01); *H01L 24/81* (2013.01); *H01L 2224/10135* (2013.01); *H01L 2224/12105* (2013.01); *H01L 2224/131* (2013.01); *H01L 2224/13009* (2013.01); *H01L 2224/13025* (2013.01); *H01L 2224/13147* (2013.01); *H01L 2224/14135* (2013.01); *H01L 2224/14136* (2013.01); *H01L 2224/14181* (2013.01); *H01L 2224/16146* (2013.01); *H01L 2224/16225* (2013.01); *H01L 2224/16227* (2013.01); *H01L 2224/29007* (2013.01); *H01L 2224/2919* (2013.01); *H01L 2224/73204* (2013.01); *H01L 2224/81141* (2013.01); *H01L 2224/81903* (2013.01); *H01L 2225/1035* (2013.01); *H01L 2225/1058* (2013.01); *H01L 2225/1076* (2013.01); *H01L 2924/1431* (2013.01); *H01L 2924/1436* (2013.01); *H01L 2924/1437* (2013.01); *H01L 2924/1438* (2013.01); *H01L 2924/1441* (2013.01); *H01L 2924/15311* (2013.01); *H01L 2924/1815* (2013.01); *H01L 2924/3511* (2013.01)

(58) Field of Classification Search
CPC ............... H01L 23/49811; H01L 23/49816; H01L 23/49827; H01L 23/49833; H01L 23/4985; H01L 24/10–24/17
See application file for complete search history.

(56) References Cited

U.S. PATENT DOCUMENTS

| | | |
|---|---|---|
| 6,027,958 A | 2/2000 | Vu et al. |
| 7,759,167 B2 | 7/2010 | Vanfleteren et al. |

(Continued)

FOREIGN PATENT DOCUMENTS

KR    1020120039464 A    4/2012

*Primary Examiner* — Khiem D Nguyen
*Assistant Examiner* — Pauline Vu
(74) *Attorney, Agent, or Firm* — William Park & Associates Ltd.

(57) ABSTRACT

Flexible stack packages are provided. The flexible stack package includes a first unit package and a second unit package which are sequentially stacked. Each of the first and second unit packages has a fixed area and a floating area. The fixed area of the first unit package is connected and fixed to the fixed area of the second unit package by a fixing part.

18 Claims, 10 Drawing Sheets

(56) References Cited

U.S. PATENT DOCUMENTS

| | | | |
|---|---|---|---|
| 2007/0210447 A1* | 9/2007 | Kinsley | H01L 24/72 257/723 |
| 2009/0255705 A1* | 10/2009 | Pratt | H01L 23/481 174/98 |
| 2012/0032321 A1* | 2/2012 | West | H01L 23/49816 257/737 |
| 2012/0112357 A1 | 5/2012 | Zhang | |

* cited by examiner

FLEXIBLE STACK PACKAGES, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Application No. 10-2013-0065006, filed on Jun. 5, 2013, in the Korean intellectual property Office, which is incorporated herein by reference in its entirety as set forth in full.

BACKGROUND

1. Technical Field

Embodiments of the present disclosure generally relate to electronic device packages and, more particularly, to flexible stack packages, electronic systems including the same, and memory cards including the same.

2. Related Art

Electronic devices employed in electronic systems may include various circuit elements, and the circuit elements may be integrated in and/or on a semiconductor substrate to constitute the electronic device (also, referred to as a semiconductor chip or a semiconductor die). The semiconductor chip or the semiconductor die may be encapsulated to form a semiconductor chip package. The semiconductor chip packages are widely employed in electronic systems such as computers, mobile systems or data storage media. Recently, flexible stack packages which are capable of bending or warping are increasingly in demand with development of the mobile systems.

Wearable electronic products are also increasingly in demand with development of the mobile systems. Thus, the wearable electronic products may also require the flexible stack packages. Since the semiconductor substrate or the semiconductor chip can be thinly fabricated to be sufficient to bend or warp it, the semiconductor package in which a single semiconductor chip is embedded may be readily fabricated to have a flexible characteristic. However, there may be some limitations in reducing a total thickness of a stack package including a plurality of stacked semiconductor chips. That is, it may be difficult to fabricate the stack package having a flexible characteristic. When the stack package is warped, a tensile stress or a compressive stress may be locally applied to some portions of the stack package and the stress may cause damage of the stack package. Accordingly, the flexible stack packages including a plurality of stacked semiconductor chips are still required.

SUMMARY

Examples of embodiments are directed to flexible stack packages, electronic systems including the same, and memory cards including the same.

According to an embodiment, a flexible stack package includes a first unit package and a second unit package which are sequentially stacked downward. Each of the first and second unit packages has a fixed area and a floating area. The fixed area of the first unit package is connected and fixed to the fixed area of the second unit package by a fixing part. Each of the first and second unit packages includes a lower flexible layer, an upper flexible layer on the lower flexible layer, and a chip between the lower and upper flexible layers.

According to an embodiment, a flexible stack package includes a first chip and a second chip which are sequentially stacked downward. Each of the first and second chips has a fixed area and a floating area. The fixed area of the first chip is connected and fixed to the fixed area of the second chip using a fixing part.

According to an embodiment, a flexible stack package includes a first unit package and a second unit package which are sequentially stacked. Each of the first and second unit packages has a fixed area and a floating area. The fixed area of the first unit package is connected and fixed to the fixed area of the second unit package by a fixing part. Each of the first and second unit packages includes a flexible layer encapsulating a chip therein.

According to an embodiment, an electronic system includes a memory and a controller coupled with the memory through a bus. The memory or the controller includes a first unit package and a second unit package which are sequentially stacked downward. Each of the first and second unit packages has a fixed area and a floating area. The fixed area of the first unit package is connected and fixed to the fixed area of the second unit package by a fixing part. Each of the first and second unit packages includes a lower flexible layer, an upper flexible layer on the lower flexible layer, and a chip between the lower and upper flexible layers.

According to an embodiment, an electronic system includes a memory and a controller coupled with the memory through a bus. The memory or the controller includes a first chip and a second chip which are sequentially stacked downward. Each of the first and second chips has a fixed area and a floating area. The fixed area of the first chip is connected and fixed to the fixed area of the second chip using a fixing part.

According to an embodiment, a memory card includes a memory including a through electrode and a memory controller controlling an operation of the memory. The memory includes a first unit package and a second unit package which are sequentially stacked downward. Each of the first and second unit packages has a fixed area and a floating area. The fixed area of the first unit package is connected and fixed to the fixed area of the second unit package by a fixing part. Each of the first and second unit packages includes a lower flexible layer, an upper flexible layer on the lower flexible layer, and a chip between the lower and upper flexible layers.

According to an embodiment, a memory card includes a memory including a through electrode and a memory controller controlling an operation of the memory. The memory includes a first chip and a second chip which are sequentially stacked downward. Each of the first and second chips has a fixed area and a floating area. The fixed area of the first chip is connected and fixed to the fixed area of the second chip using a fixing part.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in various embodiments could be termed a second element in other embodiments without departing from the teachings of the present invention.

It will also be understood that when an element is referred to as being "on", "above", "below", or "under" another element, it can be directly "on", "above", "below", or "under" the other element, respectively, or intervening elements may also be present. Accordingly, the terms such as "on", "above", "below", or "under" which are used herein are for the purpose of describing particular embodiments only and are not intended to limit the inventive concept.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent", "on" versus "directly on").

Figure 1:
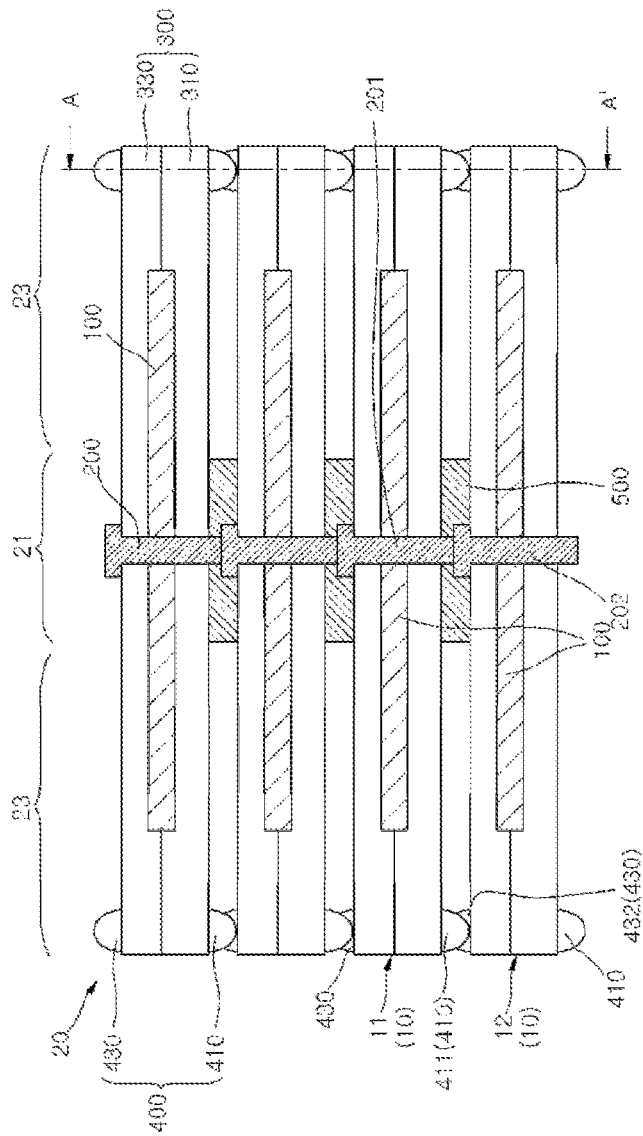
FIGS. 1 to 6 are cross sectional views illustrating flexible attack packages according to an embodiment.

Referring to FIG. 1, a flexible stack package may be configured to include a stack structure 20 having a plurality of unit packages 10 which are stacked. Each unit package 10 or the stack structure 20 may include a fixed area 21 and a floating area 23. The fixed area 21 indicates a local portion where chips 100 in the unit packages 10 stacked in the stack structure 20 are electrically and mechanically connected, and the floating area 23 indicates a flexible portion where the chips 100 in the unit packages 10 are not electrically and mechanically connected to be freely bended or warped. The floating area 23 may allow the flexible stack package to have a flexible ability. The portions of the chips 100 or the unit packages 10 in the floating area 23 may be physically or mechanically disconnected to be spaced apart from each other. That is, the portions of the chips 100 or the unit packages 10 in the floating area 23 may be unfixed to each other to seem to be floated portions.

The unit packages 10 or the chips 100, which are stacked, may be combined with each other by fixing connectors 200 disposed in the fixed area 21. The fixing connectors 200 are not disposed in the floating area 23. Thus, the portions of the chips 100 or the unit packages 10 located in the floating area 23 may be physically or mechanically disconnected from each other to be independently movable or flexible. Accordingly, the portions of the chips 100 or the unit packages 10 located in the floating area 23 may be freely warped or bended. The fixing connectors 200 may be vertically stacked to constitute a fixing part that electrically connects the chips 100 included in the stacked unit packages 10 to each other. For example, the fixing connectors 200 may be realized using a plurality of conductors such as a plurality of through electrodes, a plurality of bumps or a plurality of solder balls.

Figure 2:
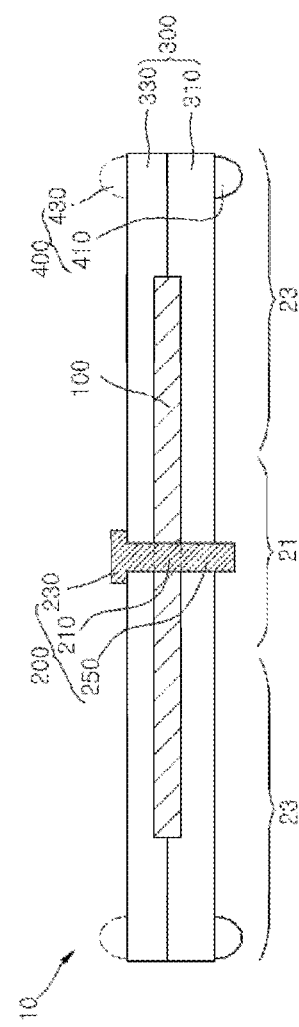

As illustrated in FIGS. 1 and 2, each of the unit packages 10 may include the chip 100 having integrated circuits integrated in and/or on a substrate and a flexible layer 300 surrounding the chip 100. The flexible layer 300 may include a lower flexible layer 310 and an upper flexible layer 330 which are laminated, and the chip 100 may be disposed between the lower flexible layer 310 and the upper flexible layer 330. That is, the chip 100 may be encapsulated by the lower flexible layer 310 and the upper flexible layer 330. The chip 100 may correspond to a semiconductor chip including integrated circuits. For example, the chip 100 may be a semiconductor memory chip such as a dynamic random access memory (DRAM) chip, a static random access memory (SRAM) chip, a flash memory chip, a magnetic random access memory (MRAM) chip, a resistive random access memory (ReRAM) chip, a ferroelectric random access memory (FeRAM) chip or a phase changeable random access memory (PcRAM) chip. Alternatively, the chip 100 may be a semiconductor non-memory chip such as a logic chip including logic integrated circuits without memory cells. The chip 100 may be construed as a die or a substrate in and/or on which integrated circuits are formed.

The fixing connectors 200 may be introduced to act as an electrical path or a signal path which is connected to an external device. Each of the fixing connectors 200 may be fabricated using a method of forming redistribution layer or may be fabricated to include a through electrode such as a through silicon via (TSV). Each of the fixing connectors 200 may include a through electrode body 210 penetrating the chip 100, a first contact portion 230 extending from the through electrode body 210 and penetrating the upper flexible layer 330 to be electrically connected to an external device, and a second contact portion 250 extending from the through electrode body 210 and penetrating the lower flexible layer 310 to be electrically connected to an external device. The through electrode body 210 may be formed of a through silicon via (TSV). The first and second contact portion 230 and 250 may be formed of bumps or redistribution layers. Each of the fixing connectors 200 may be formed of a conductive layer such as a metal layer (e.g., a copper layer) to provide an electrical connection structure.

Figure 3:
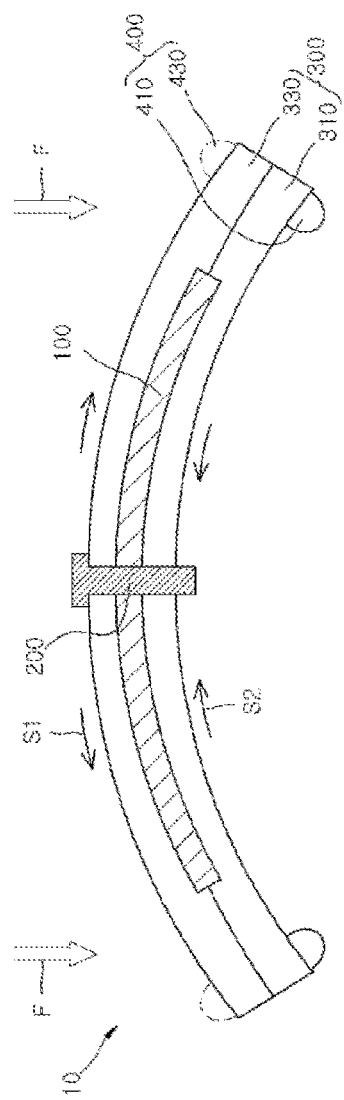

Each of the lower flexible layer 310 and the upper flexible layer 330 may include a material layer providing a stress. For example, each of the lower flexible layer 310 and the upper flexible layer 330 may include a polymer layer, a rubber layer or an elastomer layer. In various embodiments, the flexible layer 300 may be formed of a polyimide layer. The flexible layer 300 may produce a mechanical neutral plane at a region where the chip 100 is located when the chip 100 in the flexible layer 300 is warped or bended. As illustrated in FIG. 3, when the unit package 10 is warped to have a crying shape by an external force F, the chip 100 in the unit package 10 may also be warped such that the upper flexible layer 330 is extended into both edges thereof to provide a first stress S1 (e.g., a tensile stress) and the lower flexible layer 310 is compressed toward a central portion thereof to provide a second stress S2 (e.g., a compressive stress). Accordingly, the first and second stresses S1 and S2 may be offset or compensated with each other to produce a mechanical neutral plane at a region where the chip 100 is disposed. That is, no stresses may be substantially applied to the chip 100 which is disposed between the lower flexible layer 310 and the upper flexible layer 330. As a result, since a total stress applied to the chip is substantially zero, the chip 100 may be successfully warped without any destruction. Similarly, even when the unit package 10 is warped to have a smile shape, a mechanical neutral plane may be produced at a region where the chip 100 is disposed. Thus, the chip 100 may be successfully warped without any destruction.

Referring again to FIG. 1, a first unit package 11 and a second unit package 12 constituting the stack structure 20 may be combined with each other by the fixing connectors 200 in the fixed area 21. A first fixing connector 201 in the first unit package 11 may be connected and combined with a second fixing connector 202 in the second unit package 12 to combine the first unit package 11 with the second unit package 12 in the fixed area 21. An adhesive layer 500 may be locally introduced around a joint portion of the first and second fixing connectors 201 and 202 to bring the first unit package 11 into physical contact with the second unit package 12. The adhesive layer 500 may be locally introduced only in the fixed area 21 without extension into the floating area 23. Thus, the first and second unit packages 11 and 12 may be spaced apart from each other in the floating area 23. The adhesive layer 500 may include a dielectric material to protect and insulate the joint portion of the first and second fixing connectors 201 and 202 from other elements. The adhesive layer 500 may attach the first unit package 11 to the second unit package 12 such that the first and second unit packages 11 and 12 are reliably fixed to each other.

A plurality of contact protrusions 400 may be disposed on the unit packages 10 in the floating area 23, as illustrated in FIGS. 1 and 2. For example, first contact protrusions 410 may be disposed on bottom surfaces of the lower flexible layers 310 of the unit packages 10 in the floating area 23, and second contact protrusions 430 may be disposed on top surfaces of the upper flexible layers 330 of the unit packages 10 in the floating area 23. As illustrated in FIG. 1, when the first unit package 11 is stacked on the second unit package 12, the first contact protrusions 411 (or 410) on a bottom surface of the first unit package 11 may vertically extend toward a top surface of the second unit package 12 in the floating area 23 and the second contact protrusions 432 (or 430) on the top surface of the second unit package 12 may vertically extend toward the bottom surface of the first unit package 11 in the floating area 23.

Figure 4:
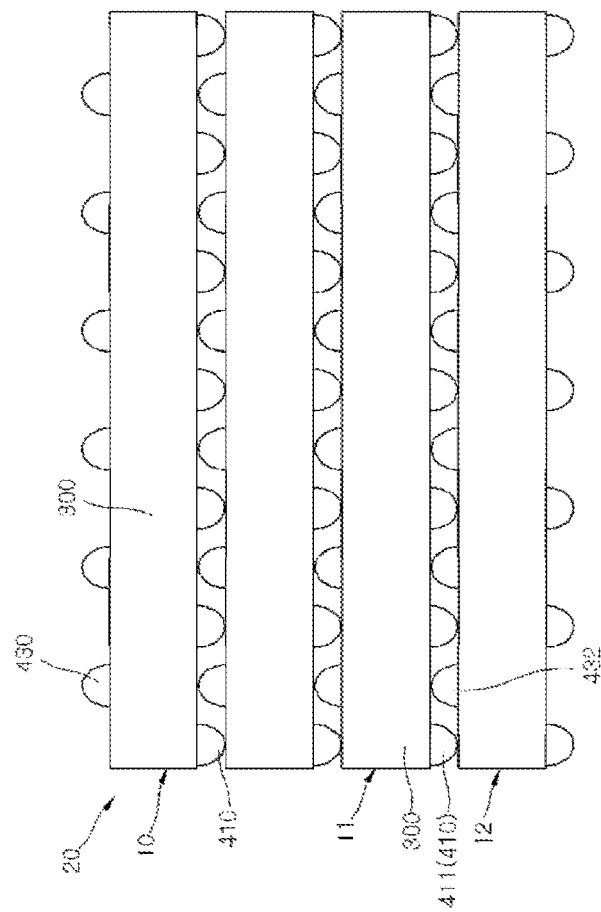

The second contact protrusions 432 (or 430) may be disposed between the first contact protrusions 411 (or 410) in the floating area 23, as illustrated in FIG. 4. FIG. 4 corresponding to a cross sectional view taken along a vertical line A-A' of FIG. 1. That is, the second contact protrusions 432 (or 430) may be vertically misaligned with the first contact protrusions 411 (or 410). Referring to FIGS. 2 and 4, the first contact protrusions 411 (or 410) may be combined with a bottom surface of the lower flexible layer 310 (or flexible layer 300) of the first unit package 11 in the floating area 23, and tip portions of the first contact protrusions 411 (or 410) may be in contact with a top surface of the upper flexible layer 330 (or flexible layer 300) of the second unit package 12 in the floating area 23. Thus, the floating area 23 of the first unit package 11 may be spaced apart from the floating area 23 of the second unit package 12 by the first contact protrusions 411 (or 410). That is, the contact protrusions 400 may be disposed between the flexible layers 300 of the unit packages 10 in the floating area 23 to support the unit packages 10 which are separated from each other. Further, the contact protrusions 400 may conduct the force applied to one of the unit packages 10 to another unit package 10 which is adjacent thereto.

Figure 5:
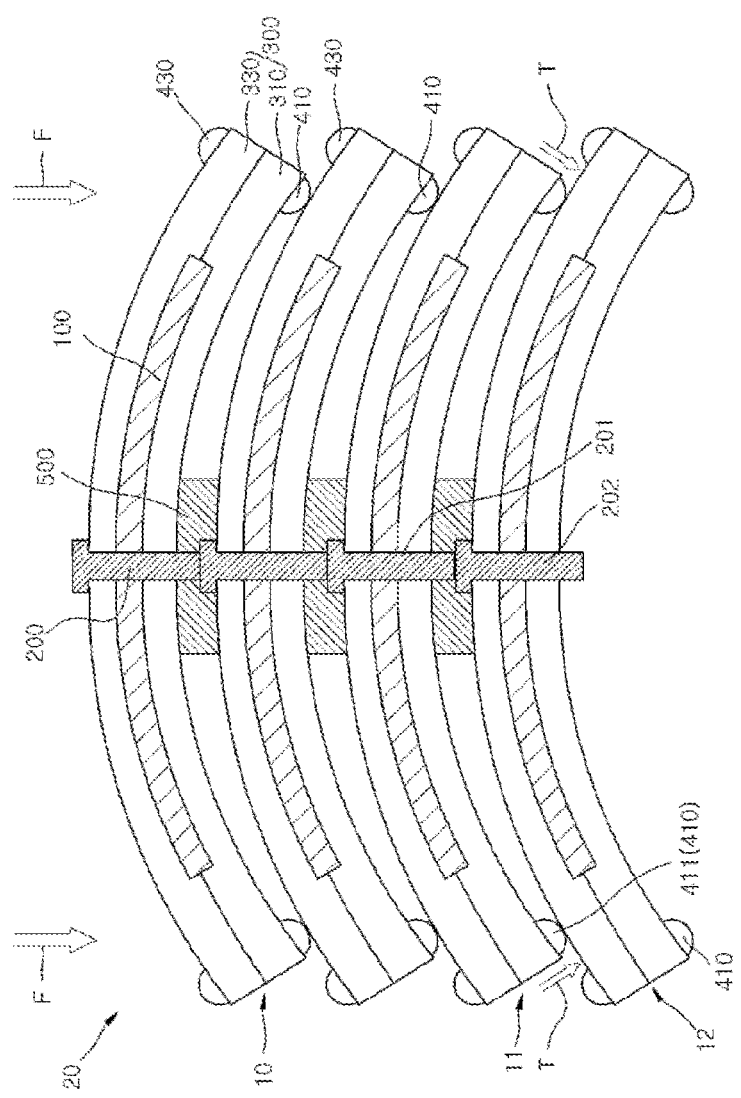

As illustrated in FIG. 5, when force F is applied to a stack package including the stack structure 20 having the stacked unit packages 10 to warp the stack package with a crying shape, the first unit package 11 may also be warped by the force F to have a crying shape and the first contact protrusions 411 (or 410) of the first unit package 11 may conduct force T produced by warpage of the first unit package 11 to the second unit package 12 contacting the first contact protrusions 411 (or 410). As a result, the second unit package 12 may also be warped by the force T conducted through the first contact protrusions 411 (or 410) to have a crying shape. The second contact protrusions 430 may also contribute to conduct of the force F. For example, if the first contact protrusions 411 (or 410) dominantly act as transmitters of the force F when the force F is applied to the stack package including the stack structure 20 to have a crying shape, the second contact protrusions 430 may dominantly act as transmitters of force when the force is applied to the stack package to have a smile shape which is an opposite configuration to the crying shape.

The contact protrusions 400 (410 and 430) do not act as joint members or fixing members that fix the unit packages 10 to each other. That is, the contact protrusions 400 (410 and 430) may be members tip portions of which are capable of sliding and moving on a surface of the flexible layer 300 unlike the fixing connectors 200. For example, the contact protrusions 400 (410 and 430) may be movable contact parts. Thus, if the first unit package 11 is warped, the second unit package 12 may also be warped and tip portions of the first contact protrusions 411 (410) of the first unit package 11 may slide on a top surface of the flexible layer 300 of the second unit package 12. As a result, contact positions of the tip portions of the first contact protrusions 411 (410) may vary on the top surface of the flexible layer 300 of the second unit package 12. As such, when the first and second unit packages 11 and 12 are warped to have the same shape, the first contact protrusions 411 (410) are fixed to the first unit package 11 whereas the tip portions of the first contact protrusions 411 (410) may merely contact the second unit package 12 and may slide on the second unit package 12. Accordingly, the first contact protrusions 411 (410) may allow the first and second unit packages 11 and 12 to freely warp.

As illustrated in FIG. 2 (see also FIG. 5), the contact protrusions 400 (410 and 430) may be attached to surfaces of the upper and lower flexible layers 310 and 330, or the contact protrusions 400 (410 and 430) may be formed using a press technique, a carving technique, or a molding technique. The contact protrusions 400 may be attached to have bump shapes and may be formed to include a dielectric material or a conductive material. For example, the contact protrusions 400 may be formed to include a polymer material, a rubber material, an elastomer material or the like. In the event that the flexible layer 300 is formed of a polyimide film, the contact protrusions 400 may be formed by applying a molding process, a pressing process or dimple process to the flexible layer 300 (i.e., the polyimide film). In such a case, the flexible layer 300 and the contact protrusions 400 may constitute a single unified body without any heterogeneous junction therebetween.

Figure 6:
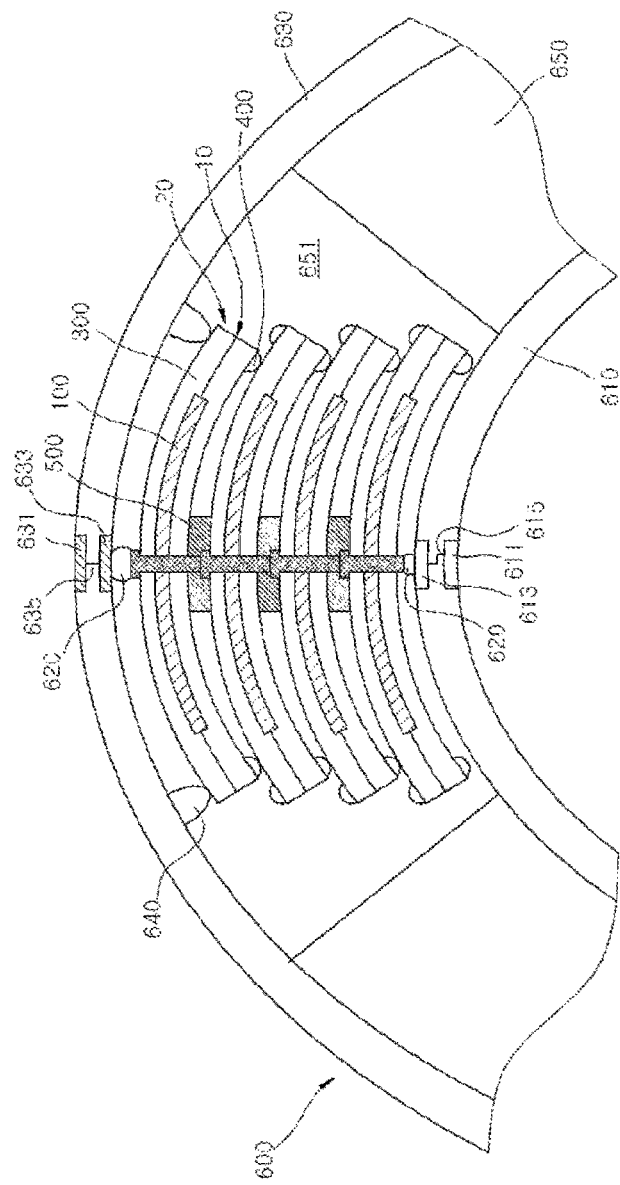

The stack structure 20 including the stacked unit packages 10 shown in FIGS. 1 and 5 may be embedded in a package substrate 600, as illustrated in FIG. 6. The package substrate 600 may be a flexible printed circuit board or a flexible embedded substrate that includes a flexible film material. The package substrate 600 may include a lower substrate 610 covering a bottom surface of the stack structure 20, an upper substrate 630 covering a top surface of the stack structure 20, and an intermediate substrate 650 disposed between edges of the lower and upper substrates 610 and 630 to provide a cavity 651 in which the stack structure 20 is located. Each of the lower substrate 610, the intermediate substrate 650 and the upper substrate 630 may include a flexible material, for example, a polymer material such as a polyimide material.

The lower substrate 610 may have an interconnection structure including a first outer connector 611, a first inner connector 613 and a first connection via 615 disposed therein, and the stack structure 20 may be electrically connected to an external device through the first outer connector 611, the first inner connector 613 and the first connection via 615. The first outer connector 611 may be disposed at a bottom surface of the lower substrate 610 to act as an electrical contact pad, the first inner connector 613 may be disposed at a top surface of the lower substrate 610 to be electrically connected to the fixing connectors 200 in the stack structure 20, and the first connection via 615 may be disposed between the first outer connector 611 and the first inner connector 613 to electrically connect the first outer connector 611 to the first inner connector 613. Similarly, the upper substrate 630 may have an interconnection structure including a second outer connector 631, a second inner connector 633 and a second connection via 635 disposed therein. That is, the second outer connector 631 may be disposed at a top surface of the upper substrate 630 to act as an electrical contact pad, the second inner connector 633 may be disposed at a bottom surface of the upper substrate 630 to be electrically connected to the fixing connectors 200 in the stack structure 20, and the second connection via 635 may be disposed between the second outer connector 631 and the second inner connector 633 to electrically connect the second outer connector 631 to the second inner connector 633. In various embodiments, a conductive substrate connector 620 may be additionally disposed between the fixing connectors 200 and the first inner connector 613, and another conductive substrate connector 620 may be additionally disposed between the fixing connectors 200 and the second inner connector 633. Each of the conductive substrate connectors 620 may be a conductive connector such as a solder ball or a bump.

At least one of the contact protrusions 400 attached to the flexible layers 300 of the unit packages 10 constituting the stack structure 20 may have a tip portion contacting the lower substrate 610 to conduct the force generated when the stack structure 20 is warped to the lower substrate 610. In various embodiments, third contact protrusions 640 may be additionally attached to a bottom surface of the upper substrate 630, and tip portions of the third contact protrusions 640 may contact a top surface of the topmost unit package 10 of the stack structure 20. In such a case, the third contact protrusions 640 may conduct the force generated when the upper substrate 630 is warped to the unit packages 10.

Figure 7:
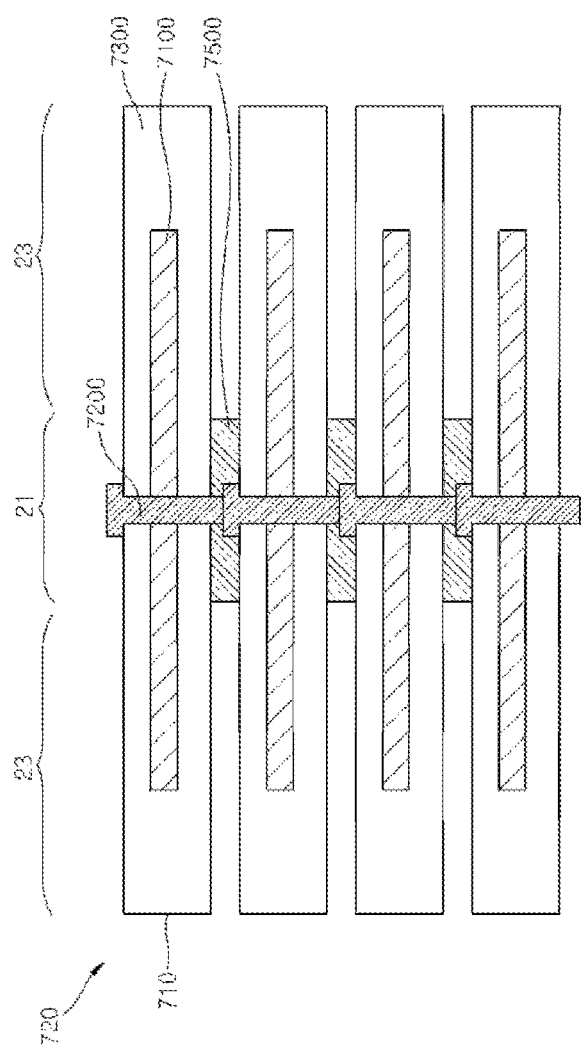
FIG. 7 is a cross sectional view illustrating a flexible stack package according to an embodiment.

Referring to FIG. 7, a flexible stack package according to various embodiments may have a stack structure 720 including a plurality of unit packages 710 which are stacked, and each of the unit packages 710 may include a chip 7100 and a flexible layer 7300 encapsulating the chip 7100. In addition, fixing connectors 7200 may be disposed in the fixed area 21 of the stack structure 720 to provide an electrical and mechanical combination structure. However, the flexible stack package illustrated in FIG. 7 may be configured even without any contact protrusions (400 of FIG. 1). The unit packages 710 may be connected and fixed to each other by the combination structure including the fixing connectors 7200 and by adhesive layers 7500 surrounding joint portions between the fixing connectors 7200 in the fixed area 21. In contrast, the unit packages 710 in the floating area 23 may be vertically spaced apart from each other even without any contact protrusions (400 of FIG. 1) due to the presence of the fixing connectors 7200 and the adhesive layers 7500.

Figure 8:
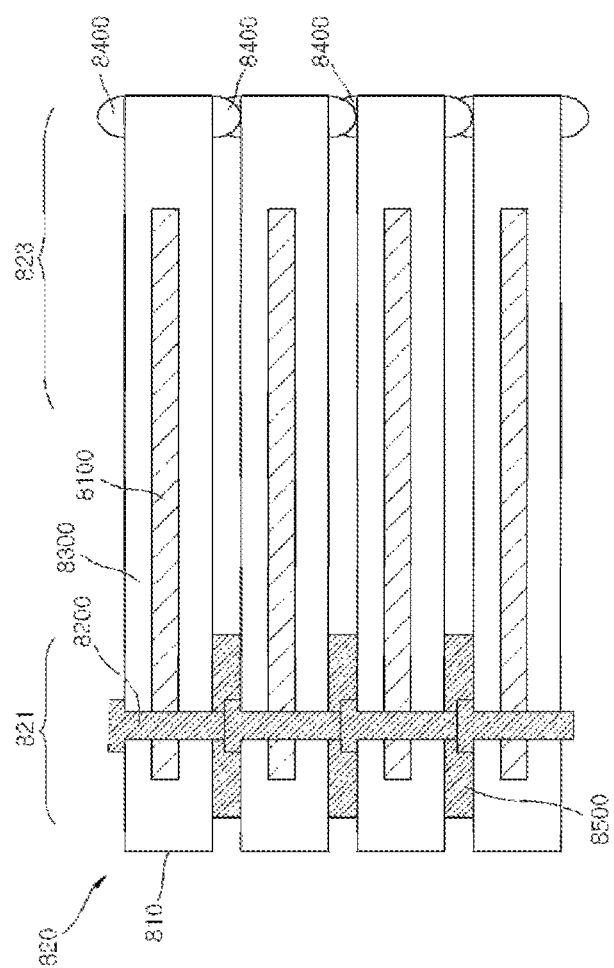
FIG. 8 is a cross sectional view illustrating a flexible stack package according to an embodiment.

Referring to FIG. 8, a flexible stack package according to various embodiments may have a stack structure 820 including a plurality of unit packages 810 which are stacked, and each of the unit packages 810 may include a chip 8100 and a flexible layer 8300 encapsulating the chip 8100. A fixed area 821 fixing the unit packages 810 may be located at an edge of the stack structure 820 and a floating area 823 where the unit packages 810 are spaced apart from each other may be located at another edge of the stack structure 820 opposite to the fixed area 821. That is, the fixed area 21 and the floating area 23 of the flexible stack package illustrated in FIGS. 1 and 7 are located at a central portion and edges of the stack structure 20 respectively, whereas the fixed area 821 and the floating area 823 of the flexible stack package illustrated in FIG. 8 are located at both edges of the stack structure 820 respectively. As a result, the present embodiments illustrated in FIG. 8 have a configuration which is modified from the embodiments shown in FIGS. 1 and 7 in terms of positions of the fixed area 821 and the floating area 823. As illustrated in FIG. 8, the fixed area 821 may include fixing connectors 8200 that mechanically fix and electrically connect the unit packages 810 to each other and adhesive layers 8500 that enhance the combination force of the fixing connectors 8200. The floating area 823 may include a plurality of contact protrusions 8400 that are disposed on the flexible layers 8300. When the stack structure 820 is warped by force applied to the stack structure 820, the contact protrusions 8400 may act as transmitters of the force between the unit packages 810.

Figure 9:
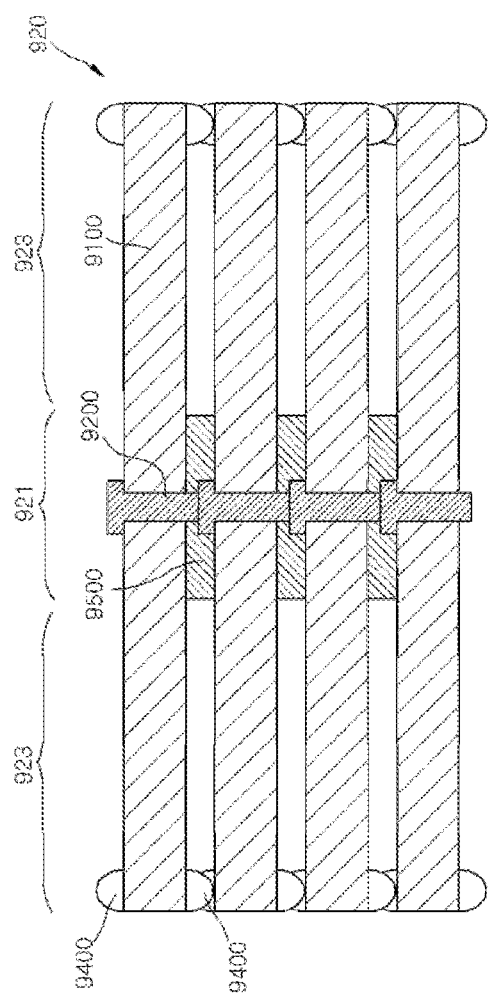
FIG. 9 is a cross sectional view illustrating a flexible stack package according to an embodiment.

Referring to FIG. 9, a flexible stack package according to various embodiments may have a stack structure 920 including a plurality of chips 9100 which are stacked, and the chips 9100 are not encapsulated by any flexible layers. That is, no flexible layers are introduced in the flexible stack package shown in FIG. 9. The flexible stack package of FIG. 9 may include a fixed area 921 located at a central portion of the stack structure 920 and a floating area 923 located at edges of the stack structure 920 like the embodiments shown in FIG. 1. Fixing connectors 9200 in the fixed area 921 may be formed of through electrodes such as through silicon vias (TSVs) penetrating the chips 9100. Alternatively, the fixing connectors 9200 may be formed to include bumps which are electrically connected to integrated circuits of the chips 9100. The fixing connectors 9200 may connect and fix the stacked chips 9100 to each other in the fixed area 921. Adhesive layer 9500 may be locally introduced around joint portions of the fixing connectors 9200 to enhance the combination force of the fixing connectors 9200 in the fixed area 921. Contact protrusions 9400 may be formed to include bumps which are attached to surfaces of the chips 9100 in the floating area 923. The chips 9100 may be spaced apart from each other by the contact protrusions 9400 interposed therebetween. The contact protrusions 9400 may act as transmitters of force between the chips 9100 when the force is applied to the stack structure 920 to warp the stack structure 920. The contact protrusions 9400 may be formed of an insulation material to electrically insulate the chips 9100 from each other.

Figure 10:
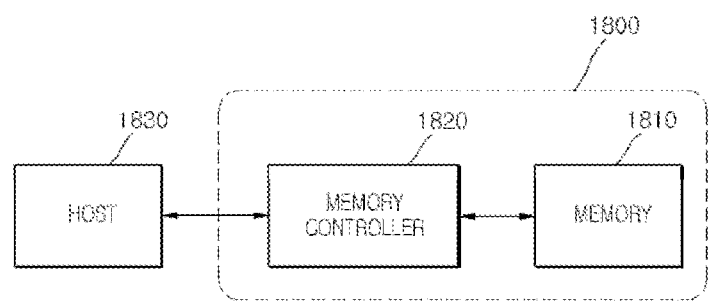
FIG. 10 is a block diagram illustrating an example of an electronic system including the flexible stack package in accordance with an embodiment.

Referring to FIG. 10, the flexible stack package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present invention is applied. The memory controller 1820 may control the memory 1810 such that stored data is read out or data is stored in response to a read/write request from a host 1830.

Figure 11:
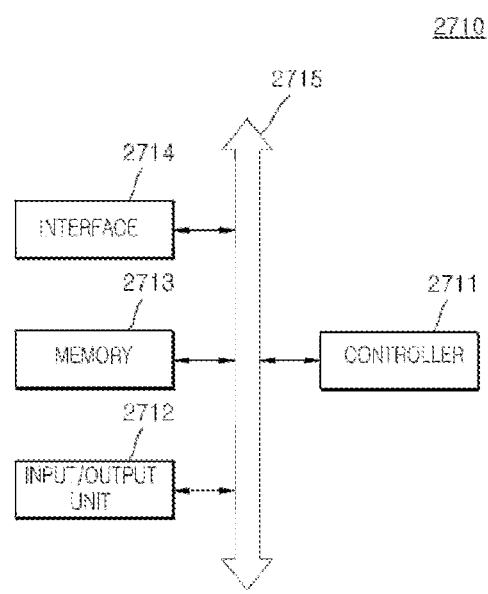
FIG. 11 is a block diagram illustrating another example of an electronic system including the flexible stack package in accordance with an embodiment.

Referring to FIG. 11, the flexible stack package in accordance with an embodiment may be applied to an electronic system 2710. The electronic system 2710 may include a controller 2711, an input/output unit 2712, and a memory 2713. The controller 2711, the input/output unit 2712 and the memory 2713 may be coupled with one another through a bus 2715 providing a path through which data move.

For example, the controller 2711 may include at least any one of at least one microprocessor, at least one digital signal processor, at least one microcontroller, and logic devices capable of performing the same functions as these components. The controller 2711 and the memory 2713 may include at least any one of the flexible stack packages according to the embodiments of the present invention. The input/output unit 2712 may include at least one selected among a keypad, a keyboard, a display device, a touch screen and so forth. The memory 2713 is a device for storing data. The memory 2713 may store data and/or commands to be executed by the controller 2711, and the likes.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In the case where the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

As described above, flexible stack packages according to the embodiments may provide stack packages which are capable of being warped of bended. In the event that the flexible stack packages are employed in wearable electronic systems, the wearable electronic systems can be improved to have a large storage capacity and a multi-functional characteristic.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A flexible stack package comprising:
   a first unit package and a second unit package which are sequentially stacked, each of the first and second unit packages having a fixed area and a floating area;
   a fixing part that connects and fixes each fixing portions of the fixed areas of the first and second unit packages,
   wherein each of the first and second unit packages includes a lower flexible layer, an upper flexible layer on the lower flexible layer, and a chip between the lower and upper flexible layers; and
   a plurality of first contact protrusions that protrude from a bottom surface of the floating area of the first unit package toward a top surface of the floating area of the second unit package,
   wherein the plurality of first contact protrusions is configured to conduct force applied to the floating area of the first unit package to the floating area of the second unit package,
   wherein the plurality of first contact protrusions is fixed on the bottom surface and is not fixed with the top surface of the floating area of the second unit package, and
   wherein the plurality of first contact protrusions is capable of sliding along a surface of the upper flexible layer.

2. The flexible stack package of claim 1, further comprising one or more second contact protrusions that protrude from a top surface of the floating area of the second unit package toward a bottom surface of the floating area of the first unit package,
   wherein at least one of the second contact protrusions are disposed between the plurality of first contact protrusions.

3. The flexible stack package of claim 1:
   wherein the first contact protrusions are combined with the lower flexible layer of the first unit package in the floating area;
   wherein tip portions of the first contact protrusions are in contact with the upper flexible layer of the second unit package in the floating area; and
   wherein the first unit package is separated from the second unit package by the first contact protrusions.

4. The flexible stack package of claim 1, wherein each of the first contact protrusions includes a polymer material, a rubber material or an elastomer material.

5. The flexible stack package of claim 1:
   wherein the lower flexible layer and the upper flexible layer of each unit package constitute a flexible layer; and
   wherein the flexible layer includes a polymer material, a rubber material or an elastomer material.

6. The flexible stack package of claim 1:
   wherein the lower flexible layer and the upper flexible layer of each unit package constitute a flexible layer; and
   wherein the flexible layer includes a polyimide material.

7. The flexible stack package of claim 1, wherein the chip of each unit, located between each lower and upper flexible layer, is encapsulated by the lower flexible layer and the upper flexible layer of each respective unit.

8. The flexible stack package of claim 1:
   wherein the fixed areas of the first and second unit packages are located at central portions of the first and second unit packages; and
   wherein the floating areas of the first and second unit packages are located at both edges of the first and second unit packages.

9. The flexible stack package of claim 1:
   wherein the fixed areas of the first and second unit packages are located at first edges of the first and second unit packages; and
   wherein the floating areas of the first and second unit packages are located at second edges of the first and second unit packages opposite to the first edges.

10. The flexible stack package of claim 1, wherein the fixing part electrically connects the first unit package to the second unit package.

11. The flexible stack package of claim 10, wherein the fixing part includes:
a first through electrode penetrating the first unit package; and
a second through electrode penetrating the second unit package.

12. The flexible stack package of claim 10, further comprising an adhesive layer that attaches the fixed area of the first unit package to the fixed area of the second unit package,
wherein the adhesive layer is disposed between the first and second unit packages to surround the fixing part.

13. The flexible stack package of claim 1, further comprising a package substrate having a cavity in which a stack structure including the first and second unit packages is located.

14. The flexible stack package of claim 13, wherein the package substrate includes:
a lower substrate covering a bottom surface of the stack structure;
an upper substrate covering a top surface of the stack structure;
an intermediate substrate disposed between edges of the lower and upper substrates to provide the cavity; and
a plurality of third contact protrusions that protrude from the upper substrate toward a top surface of the stack structure to act as transmitter of force,
wherein each of the lower substrate and the upper substrate include an interconnection structure that combines the fixing part with the lower substrate or the upper substrate.

15. The flexible stack package of claim 14, wherein the upper substrate and the lower substrate comprise a flexible material.

16. A flexible stack package comprising:
a first chip and a second chip which are sequentially stacked, each of the first and second chips having a fixed area and a floating area;
a fixing part that connects and fixes the fixed area of the first chip to the fixed area of the second chip; and
a plurality of first contact protrusions that protrude from a bottom surface of the floating area of the first chip toward a top surface of the floating area of the second chip,
wherein the plurality of first contact protrusions is configured to conduct force applied to the floating area of the first chip to the floating area of the second chip,
wherein the plurality of first contact protrusions is fixed on the bottom surface and is not fixed with the top surface of the floating area of the second chip, and
wherein the plurality of first contact protrusions is capable of sliding along a surface of an upper flexible layer of the second chip.

17. The flexible stack package of claim 16:
wherein the first contact protrusions insulate the first unit chip from the second chip; and
wherein the fixing part electrically connects the first chip to the second chip.

18. A flexible stack package comprising:
a first unit package and a second unit package which are sequentially stacked, each of the first and second unit packages having a fixed area and a floating area;
a fixing part that connects and fixes each fixing portions of the fixed areas of the first and second unit packages,
wherein each of the first and second unit packages includes a flexible layer encapsulating a chip therein; and
a plurality of first contact protrusions that protrude from a bottom surface of the floating area of the first unit package toward a top surface of the floating area of the second unit package,
wherein the plurality of first contact protrusions is configured to conduct force applied to the floating area of the first unit package to the floating area of the second unit package,
wherein the plurality of first contact protrusions is fixed on the bottom surface and is not fixed with the top surface of the floating area of the second unit package, and
wherein the plurality of first contact protrusions is capable of sliding along an upper surface of the flexible layer.

* * * * *